(12) United States Patent
Wildnagen et al.

(10) Patent No.: US 7,280,463 B2
(45) Date of Patent: Oct. 9, 2007

(54) DIGITAL FM BANDWIDTH CONTROL

(75) Inventors: Jens Wildnagen, Weirstadt (DE); Rolf Nöthlings, Stuttgart (DE)

(73) Assignee: Sony Deutschland GmbH, Cologne (DE)

( * ) Notice: Subject to any disclaimer, the term of this patent is extended or adjusted under 35 U.S.C. 154(b) by 987 days.

(21) Appl. No.: 10/309,698

(22) Filed: Dec. 4, 2002

(65) Prior Publication Data

US 2003/0103444 A1    Jun. 5, 2003

(30) Foreign Application Priority Data

Dec. 5, 2001    (EP)    ................... 01128901

(51) Int. Cl.
*H04J 1/02*    (2006.01)
(52) U.S. Cl. .................. 370/201; 375/349; 375/350; 455/266
(58) Field of Classification Search ................ 370/201; 455/266, 150.1, 220; 375/349, 350
See application file for complete search history.

(56) References Cited

U.S. PATENT DOCUMENTS

| | | | | |
|---|---|---|---|---|
| 5,287,556 | A * | 2/1994 | Cahill | ................ 455/266 |
| 5,640,686 | A * | 6/1997 | Norimatsu | ................ 455/74 |
| 5,995,567 | A | 11/1999 | Cioffi et al. | |
| 6,101,228 | A | 8/2000 | Hebron et al. | |
| 6,178,314 | B1 | 1/2001 | Whikehart et al. | |
| 6,233,443 | B1 | 5/2001 | Brommer | |
| 6,442,382 | B1 * | 8/2002 | Busking | ................ 455/266 |
| 7,035,413 | B1 * | 4/2006 | Waller et al. | ................ 381/17 |
| 2002/0110189 | A1 * | 8/2002 | Souissi et al. | ................ 375/235 |
| 2003/0081706 | A1 * | 5/2003 | Ciccarelli et al. | ........... 375/350 |

FOREIGN PATENT DOCUMENTS

| | | |
|---|---|---|
| EP | 0 578 007 | 1/1994 |
| EP | 01 127 363.8 | 11/2001 |
| EP | 1 156 589 | 11/2001 |
| EP | 1 211 802 | 6/2002 |

* cited by examiner

*Primary Examiner*—Min Jung
(74) *Attorney, Agent, or Firm*—Oblon, Spivak, McClelland, Maier & Neustadt, P.C.

(57) ABSTRACT

The bandwidth of a first variable IF filter (5) for a neighbour channel suppression of a currently received channel, which first variable IF filter (5) is arranged in a first reception path of a broadcast receiver additionally comprising at least one second reception path is controlled by obtaining at least one first quality signal corresponding to a received broadcast signal on basis of a first filtering of the received and eventually pre-processed broadcast signal with said first variable IF filter (5) set to a predetermined bandwidth, obtaining at least one second quality signal corresponding to said received broadcast signal on basis of at least one second filtering of the received and eventually pre-processed broadcast signal with a second variable IF filter (13) arranged in said at least one second reception path with a bandwidth different to the first variable IF filter (5) bandwidth and/or with a different filter characteristic, and controlling the bandwidth of the first variable IF filter (5) on basis of a the at least one first quality signal and the at least one second quality signal.

13 Claims, 2 Drawing Sheets

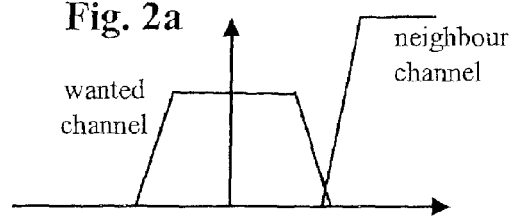

Figure 1:
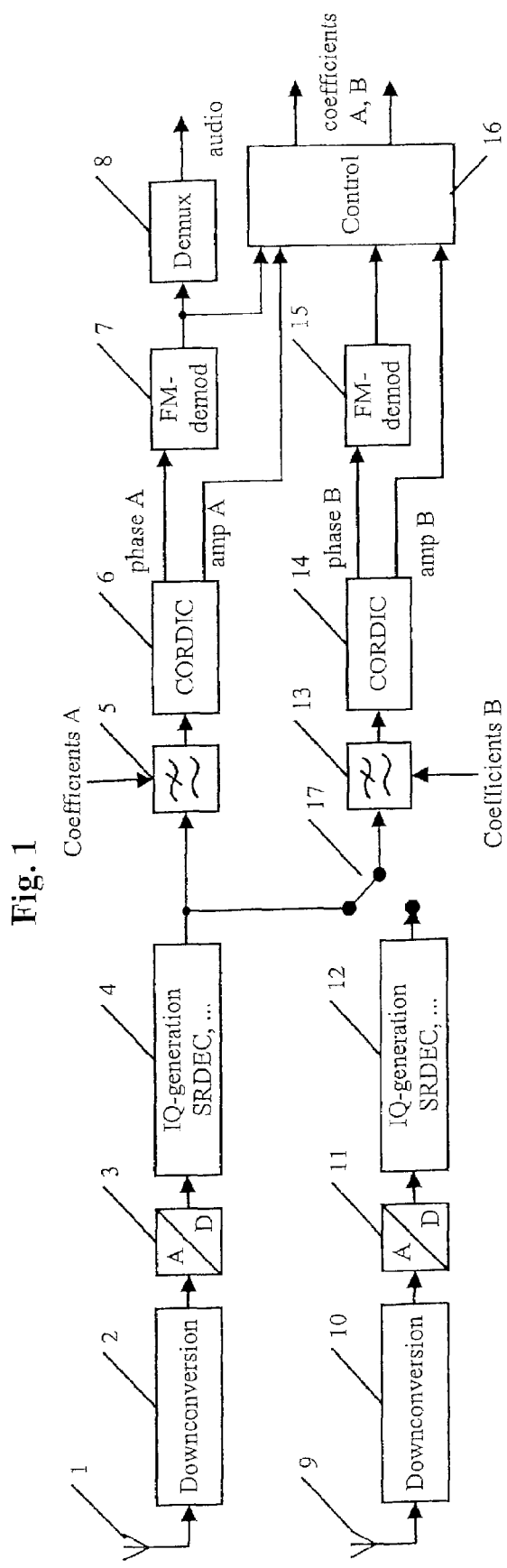

Fig. 2a wanted channel / neighbour channel

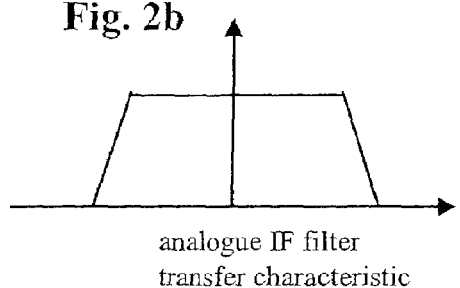

Fig. 2b analogue IF filter
transfer characteristic

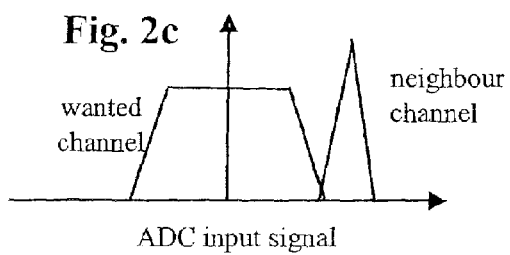

Fig. 2c wanted channel / neighbour channel

ADC input signal

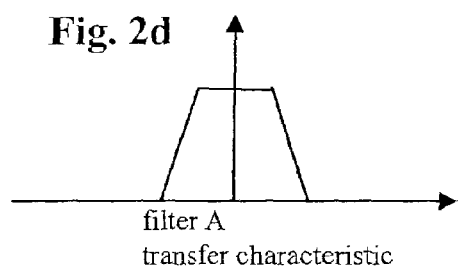

Fig. 2d filter A
transfer characteristic

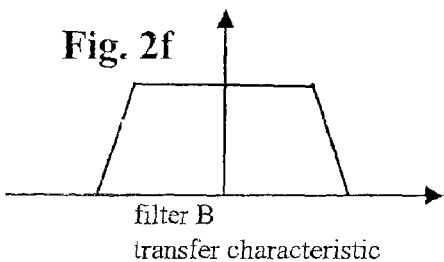

Fig. 2f filter B
transfer characteristic

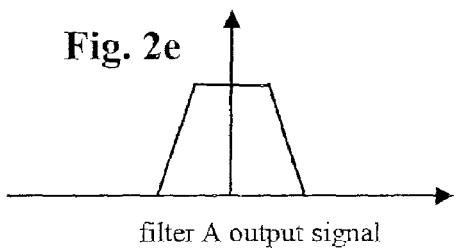

Fig. 2e filter A output signal

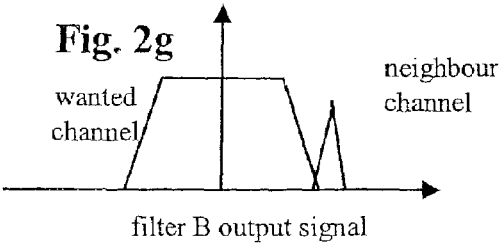

Fig. 2g wanted channel / neighbour channel filter B output signal

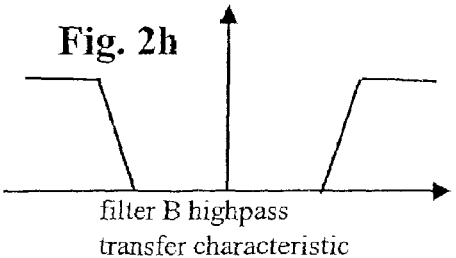

Fig. 2h filter B highpass
transfer characteristic

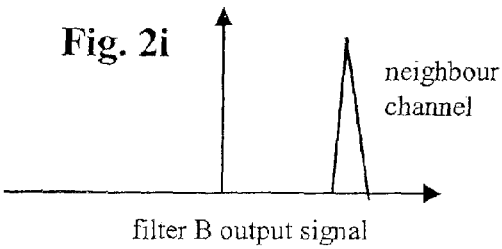

Fig. 2i neighbour channel filter B output signal

DIGITAL FM BANDWIDTH CONTROL

The present invention relates to a control of the bandwidth of a filter with variable bandwidth, in particular of an IF filter of a broadcast receiver. In particular the present invention relates to a method to control the bandwidth of a first IF filter with variable bandwidth for selecting the bandwidth of a currently received channel, i.e. a neighbour channel suppression of a currently received channel, which first IF filter with variable bandwidth is arranged in a first reception path of a broadcast receiver additionally comprising at least one second reception path and to a broadcast receiver comprising a first reception path, at least one second reception path, and a control circuit to control the bandwidth of a first IF filter with variable bandwidth for selecting the bandwidth of a currently received channel, i.e. a neighbour channel suppression of a currently received channel, which first IF filter with variable bandwidth is arranged in said first reception path of the receiver.

Frequency modulation (FM) broadcasting often suffers from adjacent channel distortions interfering in the frequency range of the wanted channel, in particular in areas with many different broadcasting stations. To suppress these distortions the IF bandwidth of an FM receiver should be set very carefully in order to keep as much information as possible.

Some existing state of the art receivers have a set of filters to suppress such adjacent channel distortions. However, as these filters are discrete realizations usually the optimal bandwidth for the actual reception situation is not provided. That means either the bandwidth is too big and therefore the adjacent channel is not suppressed sufficiently or the bandwidth is too small and information gets lost unnecessarily. Moreover, usually the filters are selected by the user, e.g. via a wide/narrow mode switch, which means that the filters are not adjusted to the actual/changing reception situation.

European Patent Applications 00 110 526.1 and 00 126 287.2 filed by the Applicant which contents are herewith included by reference into this specification disclose tunable or selectable bandwidth filters with which the actual reception situation can be considered to just suppress a disturbing adjacent channel. Therefore, unnecessary information loss can be prevented. However, in these both documents only realizations for tunable or selectable bandwidth filters are shown, but nothing is stated in respect to the actual determination of the bandwidth itself.

European Patent Application 01 127 363.8 "Channel selection filter bandwidth control" filed by the Applicant which content is herewith included by reference into this specification discloses a control for tunable bandwidth filters, in particular for tunable channel selection filters of amplitude modulation (AM) receivers.

It is the object underlying the present invention to provide a further control for a filter with variable bandwidth, e.g. an appropriate IF filter bandwidth control to control the FM bandwidth.

This object is solved according to the present invention by the method to control the bandwidth of a filter with variable bandwidth (in the following also referred to as variable IF filter) of a broadcast receiver according to independent claim 1 and a broadcast receiver according to independent claim 9. Respective preferred embodiments thereof are respectively defined in the respective following subclaims. A computer program product according to the present invention is defined in claim 8.

According to the present invention advantage is taken of the fact that modern, high quality receivers, e.g. car receivers, consist of 2 tuners. One tuner receives the audio signal and another tuner scans the alternative frequencies or checks the RDS data stream of other stations. However, even though the receiver might comprise only one tuner, parts of the receiver, for example the demodulator, might comprise two different paths. These two different reception paths of a receiver with one or more tuners can be used for the control of the bandwidth of the IF filter of the wanted channel, e.g. the channel a user listens to.

The method to control the bandwidth of a first variable IF filter for a neighbour channel suppression of a currently received channel, which first variable IF filter is arranged in a first reception path of a broadcast receiver additionally comprising at least one second reception path, comprises the steps of:

obtaining at least one first quality signal corresponding to a received broadcast signal on basis of a first filtering of the received and eventually preprocessed processed broadcast signal with said first variable IF filter set to a predetermined bandwidth, obtaining at least one second quality signal corresponding to said received broadcast signal on basis of at least one second filtering of the received and eventually preprocessed broadcast signal with a second variable IF filter arranged in said at least one second reception path with a bandwidth different to the first variable IF filter bandwidth and/or with a different filter characteristic, and controlling the bandwidth of the first variable IF filter on basis of the at least one first quality signal and the at least one second quality signal.

Preferably, said at least one first quality signal and/or said at least one second quality signal is/are based on out of band distortions of the filtered and demodulated broadcast signal.

Alternatively or additionally, said at least one first quality signal and/or said at least one second quality signal is/are based on a signal amplitude of the filtered broadcast signal.

Further alternatively or additionally, said at least one first quality signal and/or said at least one second quality signal is/are based on an out of band signal amplitude or signal energy of the filtered broadcast signal.

In the method according to the present invention, said first variable IF filter bandwidth and/or said second variable IF filter bandwidth or characteristic is preferably changed in an iterative process until a predetermined reception condition is satisfied for the currently received channel which reception condition is derivable from said at least one first quality value and said at least one second quality value.

Further, in the method according to the present invention, said broadcast signal is preferably received via one antenna and eventually undergoes one or more pre-processing stages before it is subjected simultaneously to the first and at least one second filtering.

Still further, in the method according to the present invention, different ones of said at least one first quality value and/or said at least one second quality value are preferably respectively obtained in a sequential manner.

In the broadcast receiver according to the present invention which comprises a first reception path, at least one second reception path, and a control circuit to control the bandwidth of a first variable IF filter for tuning a currently received channel, which first variable IF filter is arranged in said first reception path, said control circuit receives at least one first quality signal corresponding to a received broadcast signal on basis of a first filtering of the received and eventually preprocessed broadcast signal with said first variable IF filter set to a predetermined bandwidth, receives at least one second quality signal corresponding to said received broadcast signal on basis of at least one second filtering of the received and eventually preprocessed broadcast signal with a second variable IF filter arranged in said at least one second reception path with a bandwidth different to the first variable IF filter bandwidth and/or with a different filter characteristic, outputs a first control signal to the first variable IF filter to control the bandwidth and/or the filter characteristic thereof on basis of the at least one first quality signal and the at least one second quality signal, and outputs a second control signal to the second variable IF filter to control the bandwidth and/or the filter characteristic thereof on basis of the at least one first quality signal and the at least one second quality signal.

Preferably, said control circuit generates said first control signal and/or said second control signal so that said at least one first quality signal and/or said at least one second quality signal is/are based on out of band distortions of the filtered and demodulated broadcast signal.

Alternatively or additionally, said control circuit generates said first control signal and/or said second control signal so that said at least one first quality signal and/or said at least one second quality signal is/are based on a signal amplitude of the filtered broadcast signal.

Further alternatively or additionally, said control circuit generates said first control signal and/or said second control signal so that said at least one first quality signal and/or said at least one second quality signal is/are based on an out of band signal amplitude or signal energy of the filtered broadcast signal.

The out of band distortions of the filtered and demodulated broadcast signal, the signal amplitude of the filtered broadcast signal, and the out of band signal amplitude or signal energy of the filtered broadcast signal might be measured and/or processed as average signals, based on peak values, based on median values, etc., respectively.

In the broadcast receiver according to the present invention, preferably said control circuit changes said first variable IF filter bandwidth and/or said second variable IF filter bandwidth or characteristic in an iterative process until a predetermined reception condition is satisfied for the currently received channel which reception condition is derivable from said at least one first quality value and said at least one second quality value.

The broadcast receiver according to present invention preferably comprises a switch to disconnect an input of a second variable IF filter of one of said at least one second reception path from processing stages preceding said second variable IF filter within said second reception path and to connect said input to processing stages preceding a first variable IF filter within said first reception path. Thus, the bandwidth control in a receiver with only one downconverter can be performed as well as the bandwidth control in a receiver with 2-antenna/2-tuner support and 2 downconverters.

Therewith, according to the present invention the availability of 2 reception paths in modern receivers is used for a control of a variable IF filter, e.g. for the control of the IF bandwidth of the FM receiver.

According to the present invention e.g. a reliable selection of the IF bandwidth is possible. In state of the art bandwidth selection systems, only the out of band distortions in the demodulated signal are used for the bandwidth selection.

These out of band distortions are normally no sufficient indication for the bandwidth selection, as e.g. multipath distortions also lead to out of band distortions. According to the present invention it is also possible to use this approach to use the out of band distortion information by comparing the obtained information of two different reception paths with two different IF bandwidths. Therewith, a more precise solution is achieved.

As the present invention takes advantage from the availability of components of a 2-tuner receiver, no or only neglectable additional components (a switch) are required in such a FM receiver. Thus, a reliable IF bandwidth control can be done without additional components.

Further features, objects and advantages of the method and broadcast receiver according to the present invention will be better understood from the following detailed description of an exemplary embodiment thereof taken in conjunction with the accompanying figures, wherein FIG. 1 shows a two tuner FM broadcast receiver according to a preferred embodiment of the present invention, and FIGS. 2a to 2i show different signals and transfer characteristics to elucidate the present invention.

FIG. 1 depicts a two tuner FM broadcast receiver according to a preferred embodiment of the present invention.

A broadcast signal is received and processed by a first tuner in a first reception path, in the following also referred to as reception path A, by a first antenna 1, and supplied via a first downconversion stage 2 and a first A/D converter 3 to a first IQ generation and sampling rate decimation circuit 4 before being input to a first variable IF filter 5. The output signal of the first variable IF filter 5 is input to a first CORDIC unit 6 which outputs the phase and amplitude of the received broadcast signal to which the first tuner (i.e. the broadcast receiver) is currently tuned. The phase output by the first CORDIC unit 6 is input to a first FM demodulator 7 which output signal is supplied to a stereo demultiplexer 8 which outputs the audio signal.

A second tuner which is e.g. used to scan the alternative frequencies or to check the RDS data stream of other stations according to the prior art, receives the broadcast signal in a second reception path, in the following also referred to as reception path B, by a second antenna 9 (which might be identical to or similar as the first antenna 1), and supplied via a second downconversion stage 10 and a second A/D converter 11 to a second IQ generation circuit 12 before being input to a second variable IF filter 13 via a switch 17. The output signal of the second variable IF filter 13 is input to a second CORDIC unit 14 which outputs the phase and amplitude of the received broadcast signal to which the second tuner is currently tuned. The phase output by the second CORDIC unit 14 is input to a second FM demodulator 15. The switch 17 is able to disconnect the input of the second variable IF filter 13 from the output of the second IQ generation circuit 12 and to connect the output of the first IQ generation circuit 4 to the input of the second variable IF filter 13 instead. In this switch state (or mode), the receiver does not need to comprise a complete second reception path for the bandwidth control.

For the control of the FM bandwidth according to the present invention, both variable IF filters 5, 13 are connected to the first antenna 1 via the first down-conversion stage 2, first A/D converter 3, and first IQ generation and sampling rate decimation circuit 4. Thus, the second analogue RF circuit, i.e. the second antenna 9, the second downconversion stage 10, and the second A/D converter 11 are not required for the control of the FM bandwidth according to the present invention.

The output signals of the first FM demodulator 7 and the second FM demodulator 15 are input to a control circuit 16 which additionally receives the amplitudes output by the first CORDIC unit 6 and the second CORDIC unit 14. Based on these input signals, the control circuit 16 supplies a coefficient set A to the first variable IF filter 5 and a coefficient set B to the second variable IF filter 13.

For the control of the FM bandwidth according to the preferred embodiment of present invention, the FM signal in reception path A is filtered with a narrow bandwidth by correspondingly setting the first variable IF filter 5 on basis of appropriately selected coefficients A. The out of band distortions of the demodulated signal and/or the average signal amplitude of the FM carrier are measured in reception path A. Further, the reception path B is connected to reception path A in the above described manner. The reception path B FM signal is filtered with a wider bandwidth than the reception path A signal by correspondingly setting the second variable IF filter 13 on basis of appropriately selected coefficients B. The out of band distortions of the demodulated signal and/or average signal amplitude of the FM carrier are measured again in reception path B.

In case of no neighbour channel distortions in reception path B, the out of band distortions of the demodulated signal are equal or lower than the out of band distortions of reception path A. Distortions, caused by multipath, are disturbing both signal paths and have therefore only minor influence of the selection of the IF filter bandwidth. This is different in receivers with a state of the art bandwidth control.

As a second criterion, the average signal amplitude of both signal paths should be almost similar in case of no near by neighbour channel distortions.

As a third criterion, the average out of band signal amplitude or signal energy of the FM modulated signal can be measured. Therefore, the coefficients B of the second variable IF filter 13 of reception path B are changed in order to achieve a highpass characteristic of the second variable IF filter 13. A highpass filtering is a good indication in a digital receiver realisation with wideband analogue pre-selection filter for the near by neighbour channel distortions.

The controller 16 controls the switching of the switch 17 and the setting of the coefficient sets A and B. Preferably, the control is performed iteratively, e.g. by stepwise control of the bandwidth of the first and second variable IF filters 5, 13 until a certain condition, e.g. depending on the reception quality, is reached.

The IF filtering is usually divided into two parts: A wideband analogue IF filtering in the front-end and a narrow-band or wide-band digital neighbour channel filtering after the A/D converter (ADC). The analogue IF filter in the RF front-end which transfer characteristic is shown in FIG. 2b performs a pre-selection filtering of the FM channel as indicated in FIG. 2a. This pre-selection filtering suppresses far away distortions from the FM channel in order to avoid distortions in the demodulated audio signal caused by the limited dynamic range of the A/D converter.

The A/D converter input signal consists of the FM channel and maybe additional neighbour channel distortions, as indicated in FIG. 2c. The bandwidth of the analogue IF filter is usually wide in order to allow a high performance distortion free demodulation of the FM signal in case of no adjacent channel distortions.

FIG. 2d shows the transfer characteristic of the first variable IF filter 5 (referred to as filter A) for the first and second criteria of the above described preferred embodiment according to the present invention and FIG. 2e shows the corresponding output signal of the first variable IF filter 5. FIG. 2f shows the transfer characteristic of the second variable IF filter 13 (referred to as filter B) for the first and second criteria of the above described preferred embodiment according to the present invention and FIG. 2g shows the corresponding output signal of the second variable IF filter 13.

FIG. 2h shows the transfer characteristic of the second variable IF filter 13 for the third criterion of the above described preferred embodiment according to the present invention and FIG. 2i shows the corresponding output signal of the second variable IF filter 13.

The CORDIC algorithm is usually implemented for the FM demodulation. This CORDIC algorithm can be used for the calculation of the amplitude of a complex baseband signals in reception path A or reception path B. Of course, also other FM demodulators can be used.

In a preferred realisation, the digital demodulation of 2 tuners is realised in an ASIC. The ASIC performs the IQ-generation, sampling rate decimation, neighbour channel suppression and FM demodulation of 2 different signals. The neighbour channel suppression is done using a programmable FIR filter. The second ASIC path is not always used. In case of a 2-tuner receiver, the second path is used like it is used in a state of the 2-tuner receiver. For the selection of the bandwidth of the variable IF filter, the second signal path in the ASIC is connected to the first signal path in the above described manner. The control of the ASIC might be performed by a digital signal processor (DSP) which supplies the filter coefficient sets and controls the switch to connect the second signal path in the ASIC to the first signal path.

The invention claimed is:

1. A method for controlling a bandwidth of a first variable IF filter for neighbour channel suppression of a currently received channel, said first variable IF filter being arranged in a first reception path of a broadcast receiver, said broadcast receiver having at least one second reception path, the method comprising:
    obtaining at least one first quality signal corresponding to a received broadcast signal by filtering the received broadcast signal with said first variable IF filter set to a predetermined bandwidth;
    obtaining at least one second quality signal corresponding to said received broadcast signal by filtering the received broadcast signal with a second variable IF filter arranged in said at least one second reception path, said second variable IF filter having a bandwidth and/or filter characteristic that is different from the first variable IF filter; and
    controlling the bandwidth of the first variable IF filter based on the at least one first quality signal and the at least one second quality signal.

2. The method according to claim 1, wherein said at least one first quality signal and/or said at least one second quality signal is/are obtained based on out-of-band distortions of the filtered and demodulated broadcast signal.

3. The method according to claim 1, wherein said at least one first quality signal and/or said at least one second quality signal is/are obtained based on a signal amplitude of the filtered broadcast signal.

4. The method according to claim 1, wherein said at least one first quality signal and/or said at least one second quality signal is/are based on an out-of-band signal amplitude or signal energy of the filtered broadcast signal.

5. The method according to claim 1, wherein said first variable IF filter bandwidth and/or said second variable IF filter bandwidth or characteristic are changed in an iterative process until a predetermined reception condition is satisfied for the currently received channel, the reception condition being derivable from said at least one first quality signal and said at least one second quality signal.

6. The method according to claim 1, wherein said broadcast signal is received via one antenna and undergoes one or more pre-processing stages before it is subjected to the first and second filtering.

7. The method according to claim 1, wherein different ones of said at least one first quality signal and/or said at least one second quality signal are obtained in a sequential manner.

8. A broadcast receiver, comprising:
a first reception path, at least one second reception path, and a control circuit to control a bandwidth of a first variable if filter for neighbour channel suppression of a currently received channel, said first variable IF filter is arranged in said first reception path;
said control circuit configured to:
receive at least one first quality signal corresponding to a received broadcast signal on basis of a first filtering of the received broadcast signal with said first variable if filter set to a predetermined bandwidth;
receive at least one second quality signal corresponding to said received broadcast signal based on at least one second filtering of the received broadcast signal with a second variable IF filter arranged in said at least one second reception path, said second variable IF filter having a bandwidth, and/or filter characteristic, different from the first variable IF filter;
output a first control signal to the first variable IF filter to control the bandwidth and/or the filter characteristic thereof based on the at least one first quality signal and the at least one second quality signal; and
output a second control signal to the second variable IF filter to control the bandwidth and/or the filter characteristic thereof based on the at least one first quality signal and the at least one second quality signal.

9. The broadcast receiver according to claim 8, wherein said control circuit generates said first control signal and/or said second control signal, to obtain said at least one first quality signal and/or said at least one second quality signal based on out of band distortions of the filtered and demodulated broadcast signal.

10. The broadcast receiver according to claim 8, wherein said control circuit generates said first control signal and/or said second control signal, to obtain said at least one first quality signal and/or said at least one second quality signal based on a signal amplitude of the filtered broadcast signal.

11. The broadcast receiver according to claim 8, wherein said control circuit generates said first control signal and/or said second control signal, to obtain said at least one first quality signal and/or said at least one second quality signal based on an out of band signal amplitude or signal energy of the filtered broadcast signal.

12. The broadcast receiver according to claim 8, wherein said control circuit changes said first variable IF filter bandwidth and/or said second variable IF filter bandwidth or characteristic in an iterative process until a predetermined reception condition is satisfied for the currently received channel, the reception condition being derivable from said at least one first quality signal and said at least one second quality signal.

13. The broadcast receiver according to claim 8, further comprising
a switch to disconnect an input of the second variable IF filter of one of said at least one second reception path from processing stages preceding said second variable IF filter, within said second reception path, and to connect said input to processing stages preceding the first variable IF filter within said first reception path.

* * * * *

UNITED STATES PATENT AND TRADEMARK OFFICE
CERTIFICATE OF CORRECTION

PATENT NO. : 7,280,463 B2  
APPLICATION NO. : 10/309698  
DATED : October 9, 2007  
INVENTOR(S) : Wildhagen et al.

Page 1 of 1

It is certified that error appears in the above-identified patent and that said Letters Patent is hereby corrected as shown below:

On the title page, Item (75), the Inventors information is incorrect. Item (75) should read:

-- (75) Inventors:  Jens Wildhagen, Weinstadt (DE);  
Rolf Nöthlings, Stuttgart (DE) --

Signed and Sealed this

Eighteenth Day of March, 2008

JON W. DUDAS  
*Director of the United States Patent and Trademark Office*